(12) United States Patent
Hou et al.

(10) Patent No.: US 11,444,579 B2
(45) Date of Patent: Sep. 13, 2022

(54) SUPER-LINEAR POWER AMPLIFIERS WITH ADAPTIVE BIASING

(71) Applicant: Telefonaktiebolaget LM Ericsson (publ), Stockholm (SE)

(72) Inventors: Rui Hou, Järfälla (SE); Andre Bleker, Bålsta (SE); Lars Ridell Virtanen, Gävle (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 101 days.

(21) Appl. No.: 16/958,032

(22) PCT Filed: Dec. 17, 2018

(86) PCT No.: PCT/SE2018/051323
§ 371 (c)(1),
(2) Date: Jun. 25, 2020

(87) PCT Pub. No.: WO2019/132757
PCT Pub. Date: Jul. 4, 2019

(65) Prior Publication Data
US 2020/0373886 A1 Nov. 26, 2020

Related U.S. Application Data

(60) Provisional application No. 62/611,623, filed on Dec. 29, 2017.

(51) Int. Cl.
*H03F 3/68* (2006.01)
*H03F 1/02* (2006.01)
(Continued)

(52) U.S. Cl.
CPC .......... *H03F 1/0288* (2013.01); *H03F 3/211* (2013.01); *H03F 3/58* (2013.01); *H03F 2200/451* (2013.01)

(58) Field of Classification Search
CPC .......... H03F 1/0288; H03F 3/211; H03F 3/58; H03F 2200/451; H03F 2200/105;
(Continued)

(56) References Cited

U.S. PATENT DOCUMENTS 6,362,690 B1 * 3/2002 Tichauer ............... H03F 1/0261
330/127
7,602,244 B1 10/2009 Holmes et al.
(Continued)

FOREIGN PATENT DOCUMENTS

EP    1 959 564 A2   8/2008
EP    2 093 879 A1   8/2009
WO    2014/046582 A1 3/2014

OTHER PUBLICATIONS

International Search Report and Written Opinion issued in International Application No. PCT/SE2018/051323 dated Feb. 25, 2019 (13 pages).
(Continued)

*Primary Examiner* — Khanh V Nguyen
(74) *Attorney, Agent, or Firm* — Rothwell, Figg, Ernst & Manbeck, P.C.

(57) ABSTRACT

In one aspect, a power amplifier apparatus comprising a power amplifier (PA) and an adaptive controller is provided. The PA comprises at least one transistor and the adaptive controller is configured to control a bias voltage of the transistor based on a measured power efficiency of the PA and a measure output signal quality of the PA. In another aspect, a method of optimizing PA performance is provided. The PA comprises at least one transistor and the method includes initializing a bias voltage of the transistor, receiving measurements indicating a power efficiency and an output signal quality of the PA, evaluating the received measurements, calculating a new bias voltage for the transistor based
(Continued)

on the evaluation, and applying the calculated new bias voltage to the transistor.

24 Claims, 7 Drawing Sheets

(51) Int. Cl.
*H03F 3/21* (2006.01)
*H03F 3/58* (2006.01)

(58) Field of Classification Search
CPC ......... H03F 2200/393; H03F 2200/465; H03F 1/30; H03F 1/32; H03F 3/193; H03F 3/24; H03F 3/602; H03F 1/0272
USPC ...................................... 330/124 R, 286, 295
See application file for complete search history.

(56) References Cited

U.S. PATENT DOCUMENTS

| | | | |
|---|---|---|---|
| 8,136,081 B2 | 3/2012 | Keerthi et al. | |
| 8,269,559 B2* | 9/2012 | Tadano | H03F 1/0272 330/285 |
| 8,816,775 B2* | 8/2014 | Annes | H03F 1/0288 330/296 |
| 9,160,284 B2* | 10/2015 | Matsumoto | H03F 3/21 |
| 2009/0315622 A1* | 12/2009 | Suzuki | H03F 1/0261 330/124 R |
| 2010/0237948 A1* | 9/2010 | Nguyen | H03F 1/301 330/278 |
| 2011/0316633 A1 | 12/2011 | Tadano | |

OTHER PUBLICATIONS

Spall, James C. et al., "Model-Free Control of Nonlinear Stochastic Systems with Discrete-Time Measurements", IEEE Transactions on Automatic Control, vol. 43, No. 9, Sep. 1998 (13 pages).

Ginzton Edward L. et al., "Distributed Amplification" Proceedings of the I.R.E., Aug. 1948 (14 pages).

Aparin, Vladimir et al., "Modified Derivative Superposition Method for Linearizing FET Low-Noise Amplifiers", IEEE Transactions on Microwave Theory and Techniques, vol. 53, No. 2, Feb. 2005 (11 pages).

Grebennikov, Andrei et al., "High-Efficiency Doherty Power Amplifiers: Historical Aspect and Modem Trends", Proceedings of the IEEE, vol. 100, No. 12, Dec. 2012 (30 pages).

* cited by examiner

SUPER-LINEAR POWER AMPLIFIERS WITH ADAPTIVE BIASING

CROSS REFERENCE TO RELATED APPLICATION(S)

This application is a 35 U.S.C. § 371 National Stage of International Patent Application No. PCT/SE2018/051323, filed Dec. 17, 2018, designating the United States and claiming priority to U.S. provisional application No. 62/611,623, filed on Dec. 29, 2017. The above identified applications are incorporated by reference.

TECHNICAL FIELD

Disclosed are embodiments related to a power amplifier.

BACKGROUND

In a wireless communication system, a transmitter employs power amplifiers (PA) to boost signal power for radio transmission. Ideally, a PA should be linear, that is, the gain of a PA should not depend on signal power. In reality, however, the gain of a PA varies at different signal-power levels due to intrinsic nonlinearity of transistors. The magnitude/phase variation of the gain at different signal-power levels are called amplitude-amplitude (AM-AM)/amplitude-phase (AM-PM) distortions. Distortion degrades signal quality within the signal bandwidth and interferes with other radio users outside the signal bandwidth. Therefore, PA linearity is important for communication quality and for compliance with regulations.

Derivative superposition (DS) is a PA architecture which achieves high linearity. A DS PA is made from multiple transistors with different bias conditions, the multiple transistors configured such that complementary non-linearities from different transistors cancel each other. For example, amplitude compression of one transistor is cancelled by amplitude expansion of another transistor (i.e., AM-AM cancellation) and phase lagging of one transistor is cancelled by phase leading of another transistor (i.e., AM-PM cancellation). A more detailed explanation of the DS PA is provided in V. Aparin and L. E. Larson, "Modified derivative superposition method for linearizing FET low-noise amplifiers," in IEEE Transactions on Microwave Theory and Techniques, vol. 53, no. 2, pp. 571-581, February 2005.

An important PA property in addition to linearity is efficiency, which is defined as the ratio of useful radio frequency (RF) output power over consumed direct current (DC) power. For a single transistor, efficiency and linearity is a well-known trade-off. For example, in low-power levels, the linearity is high and the efficiency is low. Conversely, in high-power levels, the linearity is low and the efficiency is high.

Modern down-link communication signals have a large peak-to-average power ratio (PAPR). This almost always implies low average efficiency for a PA made of a single transistor. For this reason, most radio base-stations (RBS) in wireless infrastructures employ a multi-transistor PA technique, known as the Doherty Power Amplifiers (DPA). A more detailed explanation of a DPA is provided in Andrei Grebennikov and Senad Bulja, "High-Efficiency Doherty Power Amplifiers: Historical Aspect and Modern Trends", Proceedings of the IEEE, Vol. 100, No. 12, December 2012.

A DPA comprises a main branch and one or more auxiliary branches. When operating at an average power level or below the average power level, the one or more auxiliary branches are switched off and the main branch works close to compression. Accordingly, the efficiency is high. When operating at power levels above the average power level, the one or more auxiliary branches are simultaneously (i.e., multi-way DPA) or sequentially (i.e., multi-stage DPA) switched on with a gain expansion to compensate for the gain compression of the main branch, so in principle, the linearity is sustained.

In practice, most DPAs require further linearization by digital pre-distortion (DPD) to conform to modern communication standards and regulations. Alternatively, inherently linear DPAs, enabled by the DS principle, are capable of operating without DPD. A more detailed explanation of the inherently linear DPAs is provided in International Application No. PCT/SE2016/050645, the disclosure of which is hereby incorporated by reference.

In addition to linearity and efficiency, it is also desirable for PAs to operate in broad bandwidth. A PA architecture very suitable for wideband operation, for example, is the travelling-wave (TW) PA. A more detailed explanation of the TW PA is provided in E. L. Ginzton, W. R. Hewlett, J. H. Jasberg, and J. D. Noe, "Distributed Amplification," Proceedings of the IRE, vol. 36, no. 8, pp. 956-969, August 1948.

International Patent Application Publication No. WO 2016/056952 A1, "Amplifier circuit and method," the disclosure of which is hereby incorporated by reference, describes a method to enhance efficiency for TW PA with high PAPR signals.

SUMMARY

The emerging $5^{th}$ generation (5G) mobile networks employ antenna arrays for beamforming and massive multiple input multiple output (MIMO) operations. An antenna array may divide a conventional high-power PA into hundreds of low-power ones. However, the duplication of DPD for each transmitter branch becomes prohibitive in cost and power dissipation. Furthermore, the duplication of antenna arrays for multiple frequency bands is also costly from a site rental perspective. Therefore, 5G RBS brings unprecedented challenge to RF PAs with respect to linearity, efficiency, and bandwidth.

All aforementioned PA techniques, i.e., DS PA, DPA, TWPA and their variants and combinations, achieve overall linearity based on precise cancellation of complementary non-linearities from transistors. However, precise AM-AM and AM-PM cancellation is very difficult to achieve in practice. Real-life transistor non-linearity varies over fabrication process, power supply and temperature (PVT). Therefore, the different biasing conditions for the different transistor cells need to be independently adjusted, not only for each hardware implementation to accommodate process variation, but also during real-time operation to accommodate power supply and temperature variations.

One conventional solution to PVT variation is by tighter process control during the semiconductor fabrication and through supply-voltage and/or temperature insensitive designs. However, there are physical and commercial limitations to the process tolerances and supply-voltage and/or temperature insensitivities. Accordingly, the linearity performance of this solution is limited.

A second conventional solution to the PVT variation is a bias calibration procedure in the production for each individual unit followed by a real-time temperature compensation during operation. Specifically, the real-time temperature compensation measures real-time temperature by sensors and compensates the biases of transistors via a pre-characterized look-up table relating temperature to biasing conditions. This second solution has the following drawbacks. First, bias calibration for each individual unit in production is time consuming and costly to perform. Second, the temperature look-up table also has a process variation but is not feasible to characterize for each production unit, causing linearity performance limitation. Third, this solution is open-loop in nature, so any other performance influencing factors, such as supply voltage variation and aging, cannot be compensated.

A third conventional solution is a generic method which uses a closed-loop adaption algorithm to monitor, in real time, the output signal compared with an input reference signal in order to optimize the parameters of an analog circuit in real-time. A more detailed explanation of the generic method is provided in U.S. Pat. No. 8,136,081, "Method and apparatus to optimize adaptive radio-frequency systems." Laboratory experiments show that it is not straightforward to adapt this generic method to the specific problem of PA linearization by choosing distortion measures as cost functions and bias voltages as the parameters to be optimized. More specifically, laboratory experiments show that non-linearity measures (e.g. adjacent channel leakage ratio (ACLR)), as a function of bias voltages, has a surface that is not convex but saddle shaped with long narrow valleys. Consequently, optimization algorithms drive the parameters slowly towards their extremes, instead of converging to an optimum solution. In electrical terms, this means that optimizing the ACLR for a multi-transistor PA leads to a slow and monotonic increase of some bias voltages and decrease of the rest, with no turning back. Therefore, the generic method, as explained in U.S. Pat. No. 8,136,081, is not suitable for PA linearization when bias voltages are the parameters to be optimized.

The proposed solution, as provided by some of the disclosed embodiments, automates a PA to operate with intrinsic linearity and efficiency for high PAPR signals. This optimal operation is sustained over process, temperature, power supply and aging variations.

According to some of the disclosed embodiments, a power amplifier apparatus (e.g., a power amplifier arrangement) comprises: (1) a PA which consists of multiple transistors and (2) an adaptive controller. The bias voltages of these transistors are adaptively controlled by the adaptive controller according to a closed-loop adaptation algorithm. More specifically, both the RF output signal and the DC consumption of the PA are monitored to construct a novel joint cost function using bias voltages as parameters. In some embodiments, the joint cost function is convex, which allows the adaptation algorithm to converge to its minimum cost. In such embodiments, the bias voltages corresponding to the minimum cost are applied to the PA, yielding optimum PA performance with regard to linearity and efficiency.

The proposed solution, as provided by some of the disclosed embodiments, adapts transistor biases to real-time operating conditions. Therefore, the linearity performance can be optimized beyond the capability of conventional solutions such as tight semiconductor process tolerance and temperature and/or supply-voltage insensitive designs.

Compared with open-loop compensation techniques, the proposed solution avoids time consuming unit-wise calibration during production while offering better linearity performance because it accounts for random variations (e.g. long-term trapping and aging) in addition to systematic variations (e.g. temperature).

Compared with general method of closed-loop adaption techniques, as explained in U.S. Pat. No. 8,136,081, the proposed solution is more practical for the bias adaptation of multi-transistor PAs and provides several distinctive advantages.

One advantage is that the proposed solution ensures convergence by using a convex cost function. Another advantage is that the proposed solution derives linearity based only on the RF output signal and does not require an RF input signal for deriving the linearity. Accordingly, the proposed solution provides the significant advantage of not requiring input-output alignment in time. Such input-output alignment in time is known to cause closed-loop instability for certain carrier configurations with narrow carriers and large spacing, in which cases the cross correlation of input and output signals have multiple ambiguous peaks, leading to unreliable time alignment. A more detailed explanation of the input-output alignment in time is provided in S. Zhu, A. Zhang, Z. Xu, and X. Dong, "Threshold Analysis of Loop-Delay Estimation Using Correlation Functions for Double-Carrier Signals in Digital Predistortion Subsystem," IEEE Communications Letters, vol. 19, no. 3, pp. 479-482, March 2015. This problem manifests itself in DPD, which always relies on both input and output signals.

According to some of the disclosed embodiments, a power amplifier apparatus may comprise: (i) a power amplifier (PA) comprising at least one transistor and (ii) an adaptive controller configured to control a bias voltage of the transistor based on a measured power efficiency of the PA and a measured output signal quality of the PA.

In some embodiments, the PA may comprise a plurality of transistors in a configuration of one of: (i) a multi-way Doherty PA, (ii) a multi-stage Doherty PA, (iii) a travelling-wave PA, and (iv) a derivative superposition PA.

In some embodiments, the multi-way Doherty PA may comprise a main transistor and one or more auxiliary transistors, wherein the one or more auxiliary transistors are configured to simultaneously switch on with a gain expansion to compensate for gain compression of the main transistor.

In some embodiments, the multi-stage Doherty PA may comprise a main transistor and one or more auxiliary transistors, wherein the one or more auxiliary transistors are configured to sequentially switch on with a gain expansion to compensate for gain compression of the main transistor.

In some embodiments, the travelling-wave PA is configured to operate in a broad bandwidth and comprises a first transistor with a first bias condition and a second transistor with a second bias condition, wherein the first bias condition and the second bias condition are configured such that the compression distortion of the first transistor is cancelled by the expansion distortion of the second transistor.

In some embodiments, the derivative superposition PA comprises a first transistor with a first bias condition and a second transistor with a second bias condition, wherein the first bias condition and the second bias condition are configured such that the distortions from the first and the second transistor cancel each other.

In some embodiments, the first bias condition induces an amplitude compression and the second bias condition induces an amplitude expansion. In some embodiments, the first bias condition induces a phase lead and the second bias condition comprises a phase lag.

In some embodiments, the power amplifier apparatus may further comprise a signal quality monitor configured to: receive at least a portion of an output signal of the PA; measure the output signal quality of the PA at least based on the received portion of the output signal of the PA; and feed the measured output signal quality of the PA to the adaptive controller. In some embodiments, the signal quality monitor may be configured to measure the output signal quality of the PA using at least one of: (i) error vector magnitude (EVM), (ii) adjacent channel leakage ratio (ACLR), and (iii) operating-band unwanted emission.

In some embodiments, the signal quality monitor may be further configured to demodulate the portion of the output signal of the PA into a constellation diagram to measure the output signal quality of the PA using the EVM. In some embodiments, the signal quality monitor may comprise a frequency sweeping narrow band receiver configured to measure the output signal quality of the PA using the ACLR. In some embodiments, the signal quality monitor may comprise a band-limited power meter configured to measure the operating-band unwanted emission.

In some embodiments, the adaptive controller may further comprise an efficiency monitor configured to: receive at least a portion of an output signal of the PA; measure an output signal power of the PA at least based on the received portion of the output signal of the PA; measure a direct current (DC) power consumption of the PA; determine the measured power efficiency of the PA at least based on the measured output signal power of the PA and the measured DC power consumption of the PA; and feed the measured power efficiency of the PA to the adaptive controller.

In some embodiments, the adaptive controller may be configured to control the bias voltage of the transistor based on the measured power efficiency of the PA and the measured output signal quality of the PA by performing a process comprising: evaluating the measured power efficiency of the PA and the measured output signal quality of the PA; calculating a new bias voltage for the transistor based on the measured power efficiency of the PA and the measured output signal quality of the PA; and applying the calculated new bias voltage to the transistor. In some embodiments, the adaptive controller may be configured to calculate the new bias voltage by performing a process comprising: employing at least one or more of: a gradient descent algorithm, a Gauss-Newton algorithm, a Levenberg-Marquardt algorithm, and a simultaneous perturbation stochastic approximation (SPSA) algorithm.

In some embodiments, the power amplifier apparatus may further comprise a bias control circuit connected to the transistor and the adaptive controller, wherein the adaptive controller is configured to apply the calculated new bias voltage to the transistor via the bias control circuit.

In another aspect, a method performed by a power amplifier apparatus for optimizing a power amplifier (PA) performance is provided. In some embodiments, the PA comprises at least one transistor. The method includes: initializing a bias voltage of the transistor; receiving a first measurement indicating a power efficiency of the PA; receiving a second measurement indicating an output signal quality of the PA; evaluating the first and second measurement; calculating a new bias voltage for the transistor based on the evaluation of the first and second measurement; and applying the calculated new bias voltage for the transistor.

In some embodiments, the first measurement may indicate the power efficiency of the PA is measured at least based on a portion of an output signal of the PA and a direct current (DC) power consumption of the PA. In some embodiments, the second measurement indicates the output signal quality of the PA is measured at least based on a portion of an output signal of the PA.

BRIEF DESCRIPTION OF THE DRAWINGS

The accompanying drawings, which are incorporated herein and form part of the specification, illustrate various embodiments.

DETAILED DESCRIPTION

Unless defined otherwise, all terms of art, notations and other technical terms or terminology used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

As used herein the indefinite articles "a" and "an" mean at least one.

Figure 1:
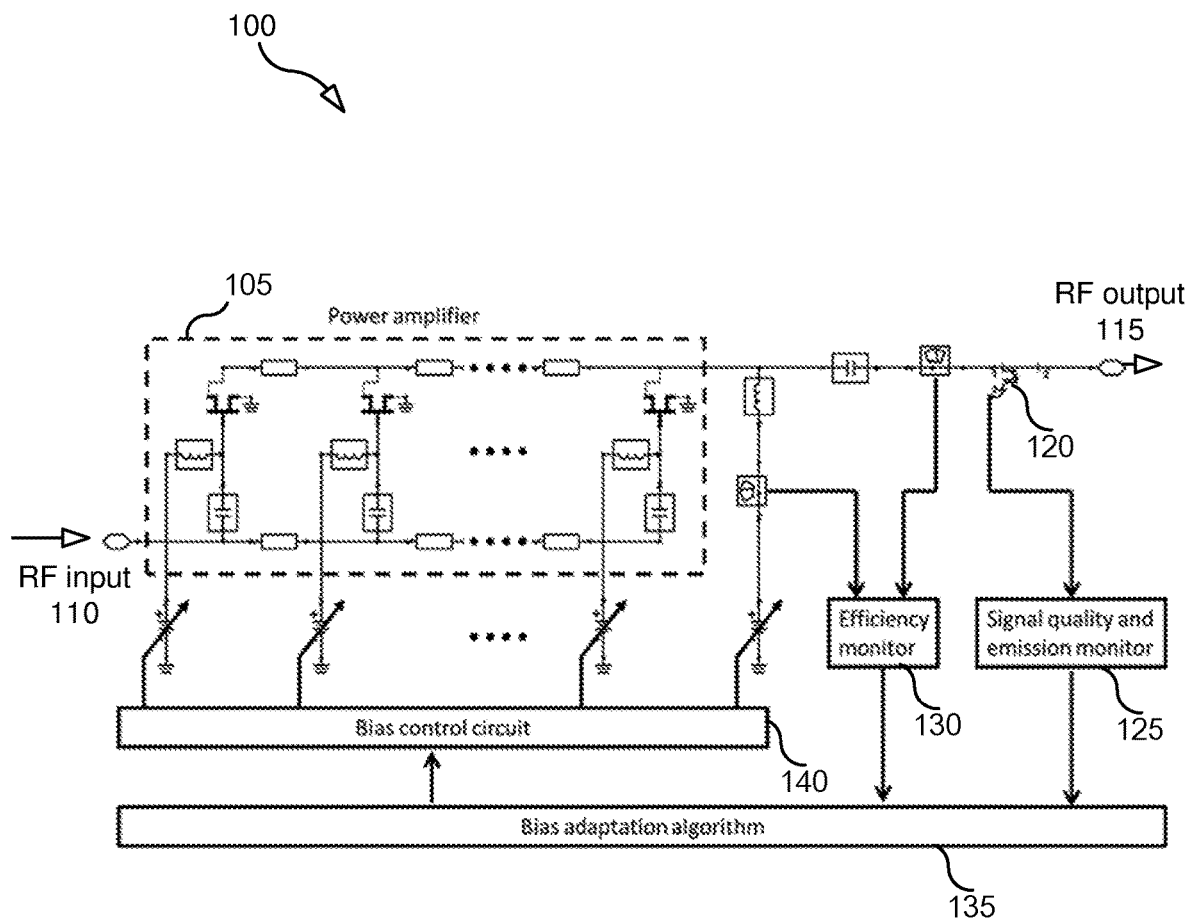
FIG. 1 shows a block diagram of a power amplifier apparatus, according to some embodiments.

FIG. 1 shows a block diagram of a power amplifier apparatus (e.g., power amplifier arrangement) 100, according to some embodiments. As shown in FIG. 1, a power amplifier (PA) 105 amplifies an RF input signal 110 to generate an RF output signal 115. In some embodiments, the PA 105 consists of multiple transistor cells with different bias conditions. In the context of the present disclosure, bias conditions are defined as direct current (DC) bias voltages applied to the terminals of the transistors.

In some embodiments, the PA 105 may be implemented as a derivative superposition (DS) amplifier. In such embodiments, the transmission lines between transistors in the DS amplifier are so short that the transmission lines can be considered as short circuits. In some embodiments, the PA 105 may be implemented as a travelling wave (TW) amplifier. In both cases (i.e., when the PA 105 is implemented as a DS amplifier and when the PA 105 is implemented as a TW amplifier), a proper selection of different bias conditions causes the multiple transistor cells to demonstrate complementary non-linearity with a precise cancellation effect. For example, amplitude compression of one transistor cell is cancelled by amplitude expansion of one or more other transistor cells (i.e., AM-AM), and phase lagging of one transistor cell is cancelled by phase leading of one or more other transistor cells (i.e., AM-PM).

In some embodiments, the PA 105 may be implemented as a Doherty Power Amplifier (DPA). In such embodiments, the PA 105 comprises a main transistor and an auxiliary transistor. It is common to bias the main transistor in Class-AB and the auxiliary transistor in Class-C. Herein, Class-AB and Class-C are bias conditions of a transistor, yielding a conduction angle under sinusoidal excitation to be 180-360 degrees and 0-180 degrees, respectively. Consequently, the gain compression of the main transistor at a certain power level is compensated by the gain expansion of the auxiliary transistor. In some embodiments, the PA 105 may comprise one or more auxiliary transistors.

As shown in FIG. 1, a small portion of the output RF signal 115 flowing from the PA 105 to an antenna is redirected by a directional coupler 120 into a signal quality monitor 125. In some embodiments, the signal quality monitor 125 measures the quality of the output RF signal in terms of, e.g., error-vector-magnitude (EVM), adjacent channel leakage ratio (ACLR), operating-band unwanted emission, or a combination of the above. Such signal quality measurements often need to comply with communication standards and regulations.

In some embodiments, the signal quality monitor 125 may be implemented as a tuned receiver configured to demodulate a sampled RF output signal 115 into a constellation diagram to measure EVM. In some embodiments, the signal quality monitor 125 may be implemented as a frequency sweeping narrow-band receiver configured to measure the ACLR. In some embodiments, the signal property monitor 125 may be implemented as a band-limited power-meter configured to measure the operating-band unwanted emission.

As shown in FIG. 1, the PA 105 behavior is also monitored by an efficiency monitor 130 configured to measure the RF output power and the DC power consumption simultaneously.

As shown in FIG. 1, the signal quality monitor 125 and the efficiency monitor 130 feeds real-time information to a bias adaptation algorithm 135. In some embodiments, an adaptive controller is configured to operate according to the bias adaptation algorithm 135. Based on the real-time information from the signal quality monitor 125 and the efficiency monitor 130, the bias adaptation algorithm 135 constantly manipulates the bias conditions of the PA 105 via a bias control circuit 140 in such a way that the bias conditions yield optimal RF output signal 115 quality and optimal PA 105 efficiency.

Figure 2:
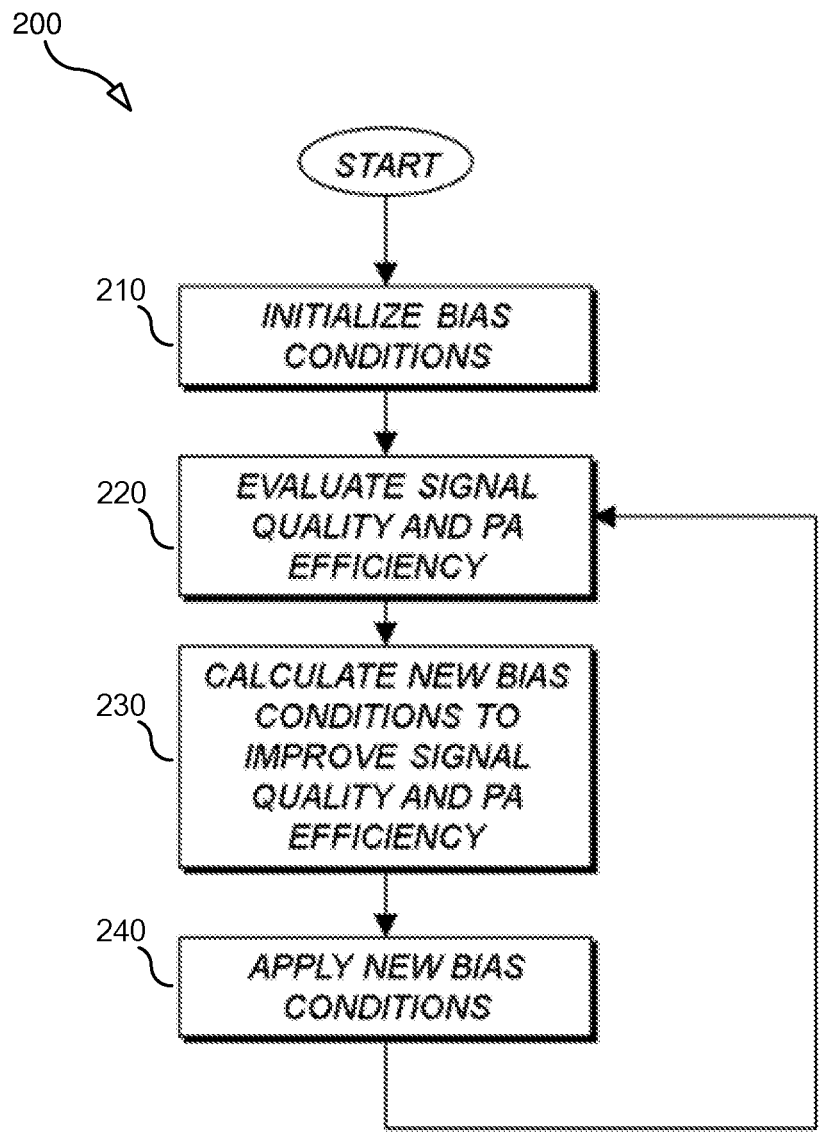
FIG. 2 illustrates a flow chart illustrating a process according to one embodiment.

FIG. 2 illustrates a flowchart illustrating a process 200 according to one embodiment. The process 200 shows an implementation of the bias adaptation algorithm 135 according to one embodiment. The process 200 starts in step 210 in which an initial set of bias conditions are generated and applied to the PA 105 via the bias control circuit 140.

Next, the bias adaptation algorithm 135 enters an iteration comprising three steps (e.g., steps 220, 230, and 240). In step 220, the bias adaptation algorithm 135 evaluates the output RF signal quality and the PA 105 efficiency via the signal quality monitor 125 and the efficiency monitor 130, respectively.

In step 230, the bias adaptation algorithm 135 calculates new bias conditions in order to improve the signal properties of the RF output signal 115. In some embodiments, the calculation of the new bias conditions in step 230 may be based on current and past signal quality and PA efficiency evaluations.

In some embodiments, various optimization algorithms can be used for the calculation of new bias conditions in step 230. For example, one implementation of the optimization algorithm may be gradient based. In such an implementation, all past signal-quality evaluations are used to construct a functional model, relating bias conditions to the output signal properties, according to some embodiments. Subsequently, the new bias conditions (i.e., the bias conditions related to the output signal properties) can be calculated by gradient descent, Gauss-Newton, or Levenberg-Marquardt algorithms. In some embodiments, an implementation of the optimization algorithm may be non-gradient based, such as the simultaneous perturbation stochastic approximation (SPSA). A more detailed explanation of the SPSA is provided in J. C. Spall and J. A. Cristion, "Model-free control of nonlinear stochastic systems with discrete-time measurements," IEEE Transactions on Automatic Control, vol. 43, no. 9, pp. 1198-1210, September 1998.

In step 240, the calculated new bias conditions are applied to the PA 105 via the bias control circuit 140.

In the following description, a non-limiting exemplary implementation of the proposed solution with reference to the disclosed embodiments in FIG. 1 and FIG. 2 is described.

In this exemplary implementation, the PA 105 is a typical derivative superposition (DS) amplifier consisting of multiple field-effect-transistor (FET) cells in parallel. The gates of the FETs may be biased by two different DC voltage sources. The RF input signal 110 is a 5 MHz LTE signal. In this exemplary implementation, the signal quality monitor 125 comprises a frequency-sweep narrowband receiver with 1 kHz resolution bandwidth and 20 MHz frequency sweep range. The signal quality monitor 125 monitors the RF output signal 115 and the ACLR is measured from the monitored spectrum to indicate signal quality. The RF power and DC power consumption are also measured by the efficiency monitor 130 to calculate the PA 105 efficiency.

Figure 3:
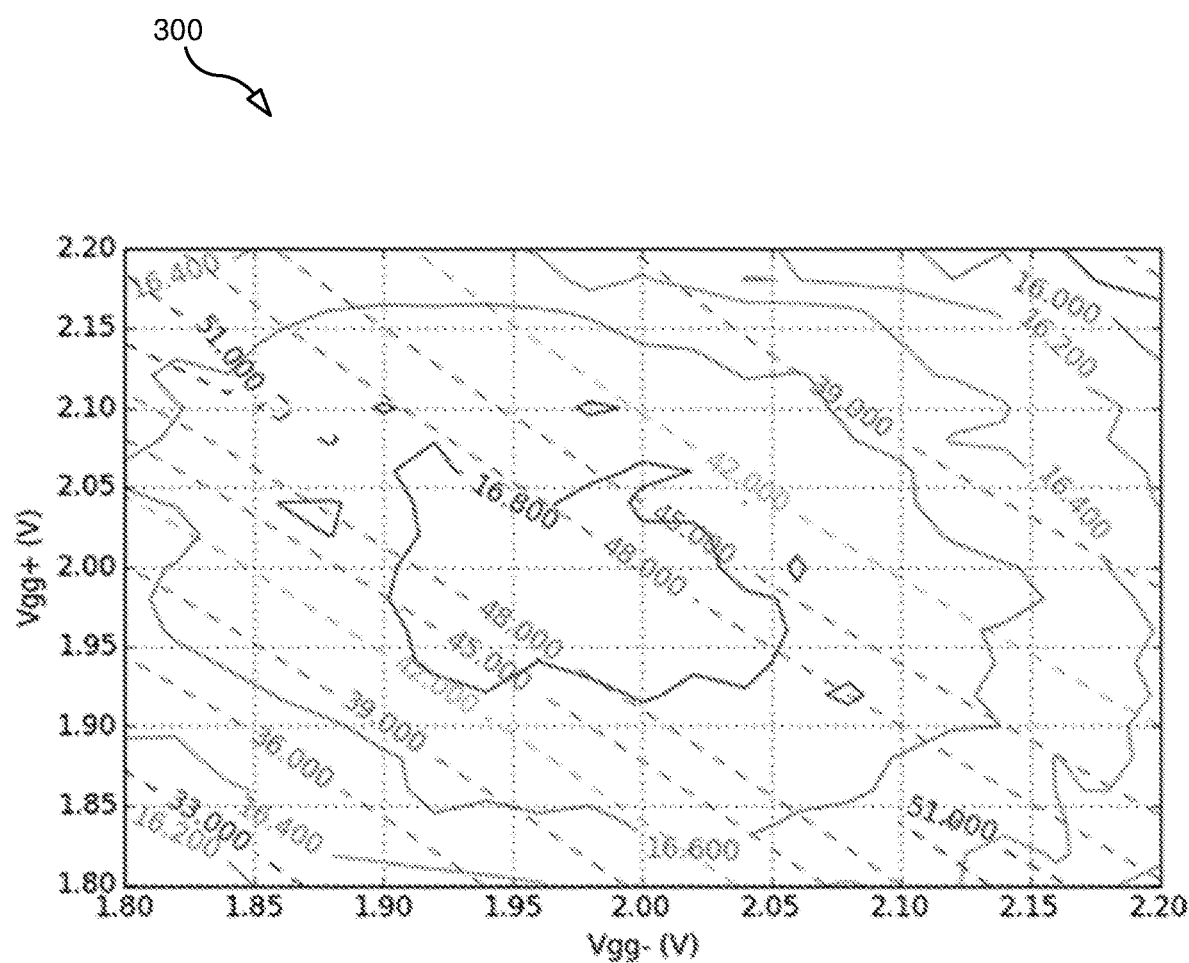
FIG. 3 illustrates measured signal quality and power amplifier efficiency according to one embodiment

In this exemplary implementation, the measured ACLR and efficiency are shown as functions of bias voltages in plot 300 of FIG. 3. The plot 300 shows the measured ACLR as dashed lines and the measured efficiency as solid lines. As shown in the plot 300, the measured ACLR varies from 33 dBc to 51 dBc, spanning a gate voltage variation of 0.4 V (e.g., 1.80V-2.20V). The contour of the measured ACLR as a function of the bias voltages forms a saddle shape with a long narrow valley, the long narrow valley illustrated in FIG. 3 as a diagonal strip crossing through the middle of plot 300 from the top left corner of plot 300 to the bottom right corner of plot 300. It is well known that convergence problems occur when this contour is used as the cost function for bias adaption, because the bias point will slowly move down from the outer perimeters of plot 300 into the narrow valley and through the narrow valley in the north-west direction (e.g., towards the top left corner of plot 300) or the south-east direction (e.g., towards the bottom right corner of plot 300), without turning back. In contrast, the contour of the measured efficiency as a function of the bias voltages form a basin shaped cost function. Accordingly, convergence can be ensured by using the measured ACLR and the efficiency to reach a global minimum point, that is, close to the centre of the plot 300.

Figure 4:
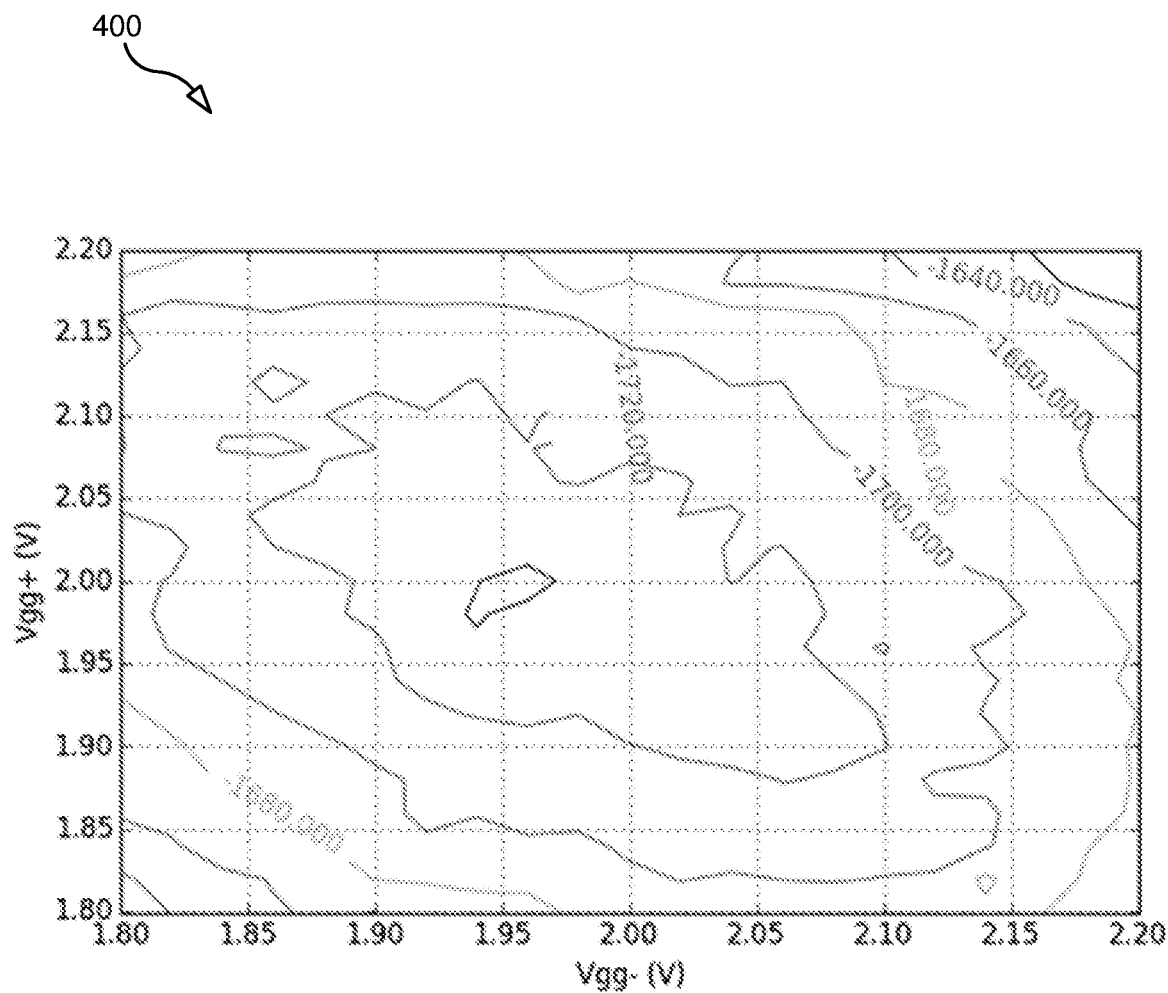
FIG. 4 illustrates a joint cost function according to one embodiment.

In this exemplary implementation, a joint cost function is calculated as $-10*$efficiency (in %)—ACPR (in dB), which accounts for both efficiency and linearity, and depicted as plot 400 in FIG. 4. This formulation of the joint cost function, however, is not required and any variation and/or combination of efficiency linearity for the joint cost function may be formed in alternative embodiments. As shown in plot 400, the joint cost function is also basin shaped, which ensures convergence to the minimum-cost point.

Figure 5:
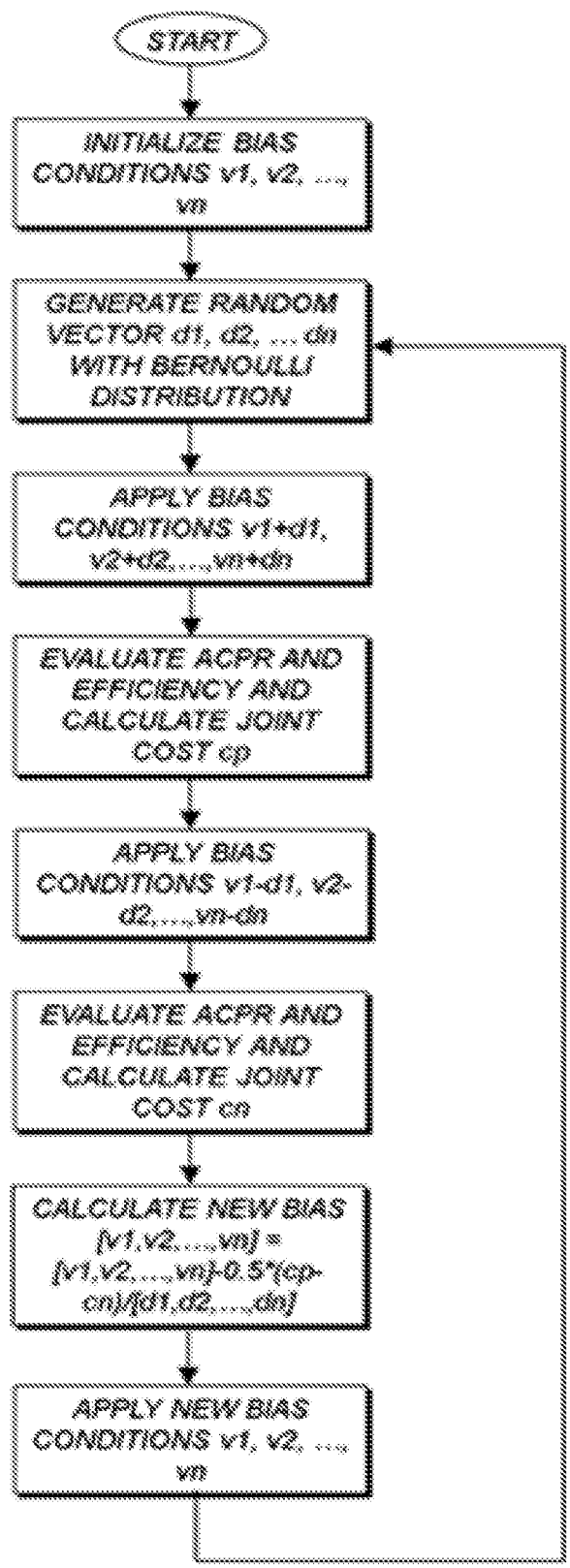
FIG. 5 illustrates a flow chart illustrating a process according to one embodiment.

In this exemplary implementation, the SPSA algorithm is used as the bias adaptation algorithm and FIG. 5 shows a flow chart illustrating a process 500 of the SPSA algorithm, according to one embodiment.

Figure 6A:
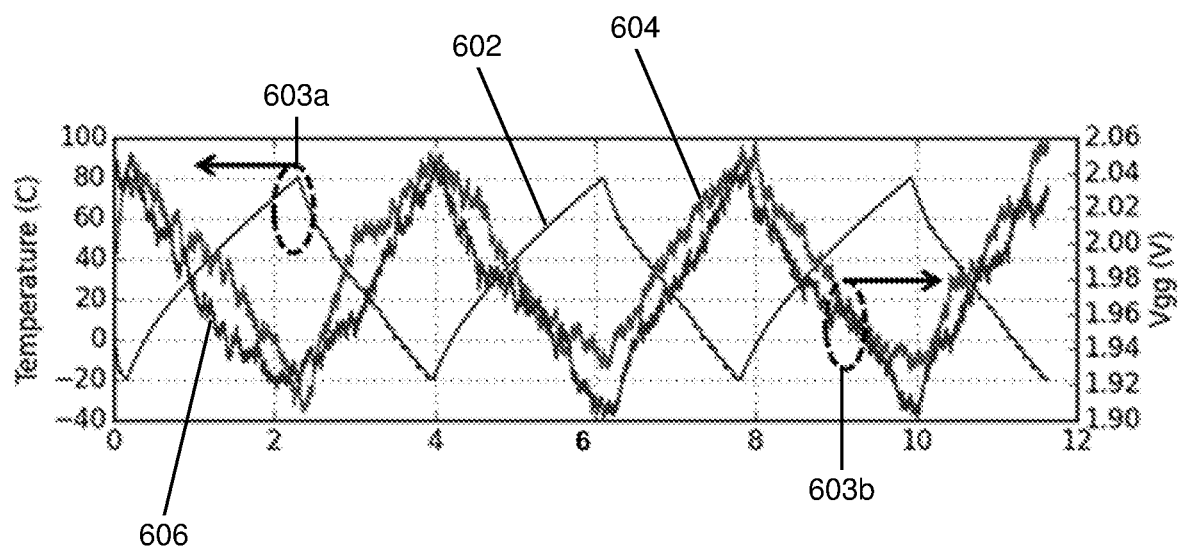
FIGS. 6A-B illustrate measurement results according to some embodiments.
Figure 6B:
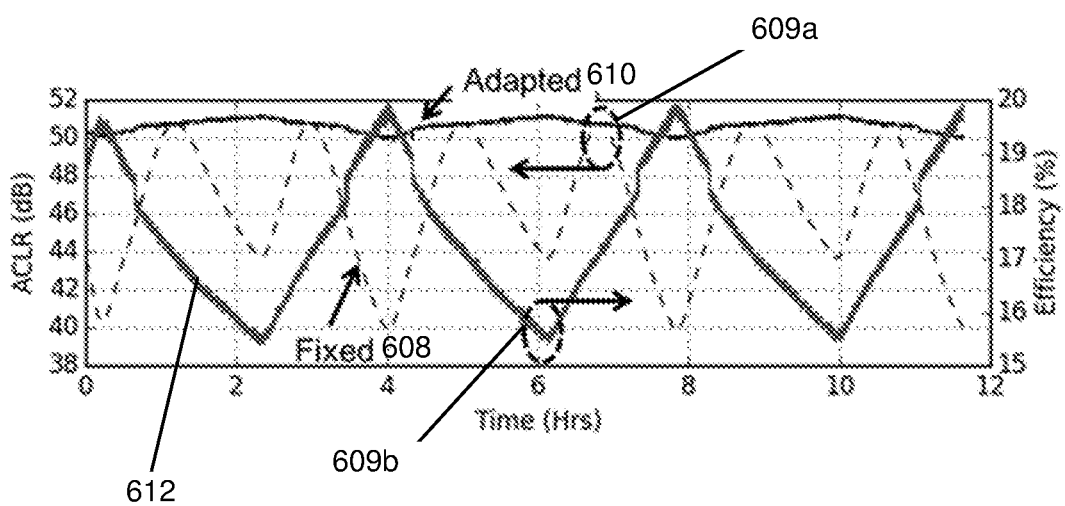

Laboratory validation results for the proposed solution will be provided in the following description. To validate the effectiveness of the proposed solution, the PA 105 has been subjected to temperature cycles from −20 to 80 Celsius. More specifically, the proposed PA 105 with adaptive bias voltages has been compared with the same PA with fixed bias voltages, with reference to efficiency and ACPR. The measurement results are shown in FIGS. 6A-B. As shown in FIG. 6A, the temperature (plotted as line 602) starts around 40 Celsius and ramps up and down for 3 cycles during a period of 12 hours. Gate voltages Vgg+ and Vgg− are plotted as lines 606 and 604, respectively. The circles 603a-b group the plotted lines in FIG. 6A and the arrows indicate which axis (e.g., temperature and Vgg) reflects the values for the line(s) grouped by the corresponding circle. For example, the arrow of the circle 603a grouping line 602 points towards the temperature. As another example, the arrow of the circle 603b grouping lines 604 and 606 points towards voltage. As shown in FIG. 6B, ACLR for the PA with fixed bias voltages (plotted as line 608) varies with temperature between 40 to 51 dBc. In contrast, the ACLR for the proposed PA 105 with adaptive bias voltages (plotted as line 610) does not fall below 50 dBc. The efficiency is plotted as line 612 in FIG. 6B. The circles 609a-b group the plotted line in FIG. 6B and the arrows indicate which axis (e.g., ACLR and Efficiency) reflects the values for the line(s) grouped by the corresponding circle. For example, the arrow of the circle 609b grouping line 612 points towards the efficiency percentage. As another example, the arrow of the circle 609a grouping lines 608 and 610 points towards the ACLR (dB). Accordingly, this sustained high linearity performance over temperature validates the effectiveness of the proposed solution.

Figure 7:
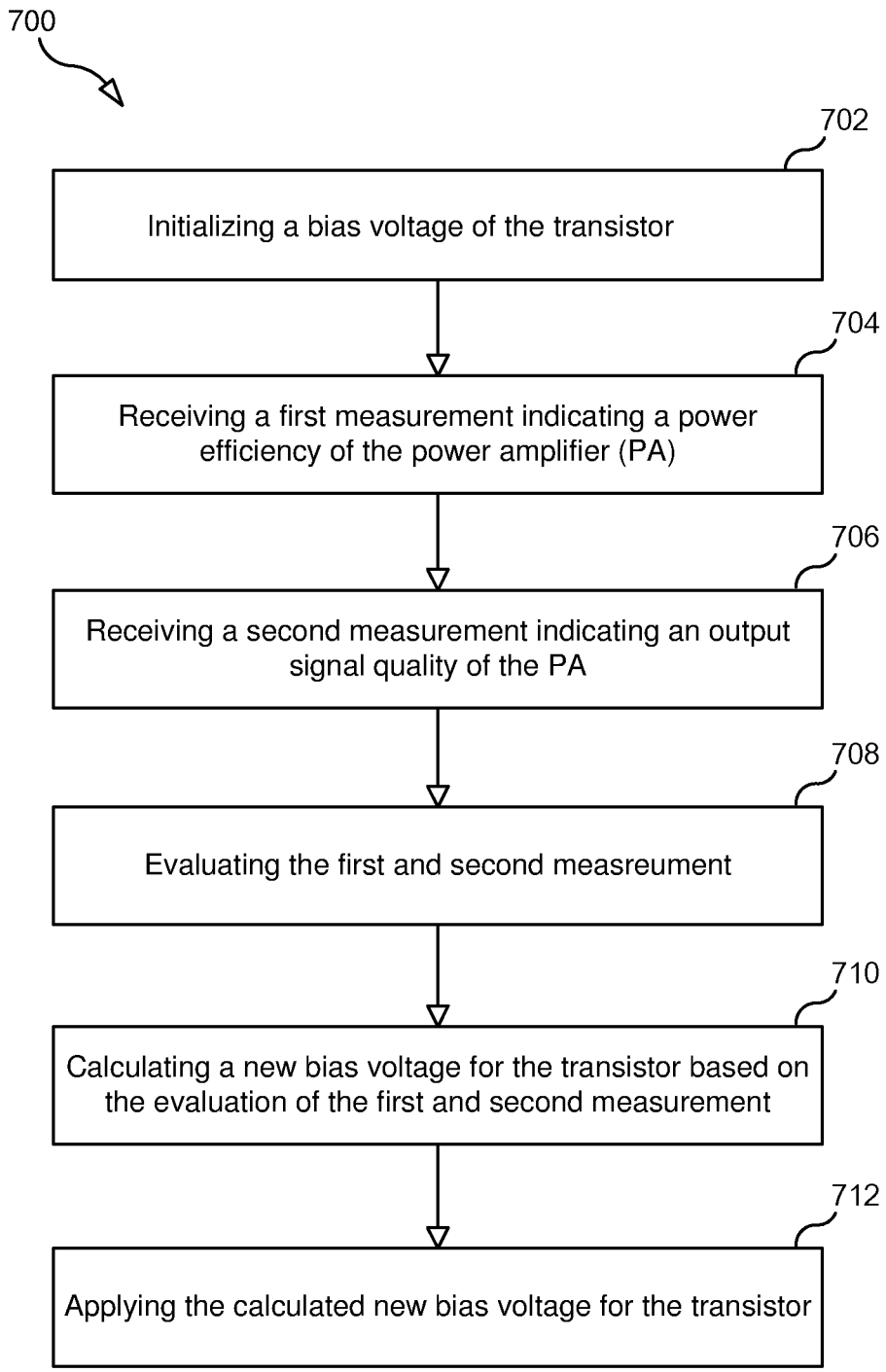
FIG. 7 illustrates a flow chart illustrating a process according to one embodiment.

FIG. 7 is a flow chart illustrating a process 700 performed by a power amplifier apparatus for optimizing a power amplifier (PA) performance, according to some embodiments. In some embodiments, the PA comprises at least one transistor.

Process 700 may begin with step 702 in which the power amplifier apparatus initializes a bias voltage of the transistor.

In step 704, the power amplifier apparatus receives a first measurement indicating a power efficiency of the PA. In some embodiments, the first measurement indicating the power efficiency of the PA is measured at least based on a portion of an output signal of the PA and a direct current (DC) power consumption of the PA.

In step 706, the power amplifier apparatus receives a second measurement indicating an output signal quality of the PA. In some embodiments, the second measurement indicating the output signal quality of the PA is measured at least based on a portion of an output signal of the PA.

In step 708, the power amplifier apparatus evaluates the first and second measurement.

In step 710, the power amplifier apparatus calculates a new bias voltage for the transistor based on the evaluation of the first and second measurement.

In step 712, the power amplifier apparatus applies the calculated new bias voltage for the transistor.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

Abbreviations

At least some of the following abbreviations may be used in this disclosure. If there is an inconsistency between abbreviations, preference should be given to how it is used above. If listed multiple times below, the first listing should be preferred over any subsequent listing(s).

5G $5^{th}$ generation mobile networks
ACLR adjacent channel leakage ratio
ACPR adjacent channel power ratio
DPA Doherty power amplifier
DPD digital pre-distortion
DS derivative superposition
EVM error vector magnitude
FET field effect transistor
LTE long term evolution
MIMO multiple input multiple output antenna
PA power amplifier
PAPR peak to power ratio
RBS radio base station
SPSA simultaneous perturbation stochastic approximation
TW travelling wave

The invention claimed is:

1. A power amplifier apparatus comprising:
a power amplifier (PA) comprising at least one transistor;
an adaptive controller configured to control a bias voltage of the transistor based on a measured power efficiency of the PA and a measured output signal quality of the PA; and
a signal quality monitor configured to:
receive at least a portion of an output signal of the PA;
measure the output signal quality of the PA at least based on the received portion of the output signal of the PA and using at least one of: (i) error vector magnitude (EVM) or (ii) operating-band unwanted emission; and
feed the measured output signal quality of the PA to the adaptive controller.

2. The power amplifier apparatus of claim 1, wherein the PA comprises a plurality of transistors in a configuration of one of: (i) a multi-way Doherty PA, (ii) a multi-stage Doherty PA, (iii) a travelling-wave PA, and (iv) a derivative superposition PA.

3. The power amplifier apparatus of claim 2, wherein the multi-way Doherty PA comprises:
a main transistor; and
one or more auxiliary transistors, wherein the one or more auxiliary transistors are configured to simultaneously switch on with a gain expansion to compensate for gain compression of the main transistor.

4. The power amplifier apparatus of claim 2, wherein the multi-stage Doherty PA comprises:
a main transistor;
one or more auxiliary transistors, wherein the one or more auxiliary transistors are configured to sequentially switch on with a gain expansion to compensate for gain compression of the main transistor.

5. The power amplifier apparatus of claim 2, wherein the travelling-wave PA is configured to operate in a broad bandwidth and comprises:
a first transistor with a first bias condition; and
a second transistor with a second bias condition, wherein the first bias condition and the second bias condition are configured such that the compression distortion of the first transistor is cancelled by the expansion distortion of the second transistor.

6. The power amplifier apparatus of claim 2, wherein the derivative superposition PA comprises:
a first transistor with a first bias condition; and
a second transistor with a second bias condition, wherein the first bias condition and the second bias condition are configured such that the distortions from the first and the second transistor cancel each other.

7. The power amplifier apparatus of claim 5, wherein the first bias condition induces an amplitude compression and the second bias condition induces an amplitude expansion.

8. The power amplifier apparatus of claim 5, wherein the first bias condition induces a phase lead and the second bias condition induces a phase lag.

9. The power amplifier apparatus of claim 1, wherein the signal quality monitor is configured to measure the output signal quality of the PA using error vector magnitude (EVM).

10. The power amplifier apparatus of claim 1, wherein the signal quality monitor is further configured to demodulate the portion of the output signal of the PA into a constellation diagram to measure the output signal quality of the PA using the EVM.

11. The power amplifier apparatus of claim 1, wherein the signal quality monitor comprises a frequency sweeping narrow band receiver configured to measure the output signal quality of the PA.

12. The power amplifier apparatus of claim 1, wherein the signal quality monitor comprises a band-limited power meter configured to measure the operating-band unwanted emission.

13. The power amplifier apparatus of claim 1, further comprising:
an efficiency monitor configured to:
receive at least a portion of an output signal of the PA;
measure an output signal power of the PA at least based on the received portion of the output signal of the PA;
measure a direct current (DC) power consumption of the PA;
determine the measured power efficiency of the PA at least based on the measured output signal power of the PA and the measured DC power consumption of the PA; and
feed the measured power efficiency of the PA to the adaptive controller.

14. The power amplifier apparatus of claim 1, wherein the adaptive controller is configured to control the bias voltage of the transistor based on the measured power efficiency of the PA and the measured output signal quality of the PA by performing a process comprising:
evaluating the measured power efficiency of the PA and the measured output signal quality of the PA;
calculating a new bias voltage for the transistor based on the measured power efficiency of the PA and the measured output signal quality of the PA; and
applying the calculated new bias voltage to the transistor.

15. The power amplifier apparatus of claim 14, wherein the adaptive controller is configured to calculate the new bias voltage by performing a process comprising:
employing at least one or more of: a gradient descent algorithm, a Gauss-Newton algorithm, a Levenberg-Marquardt algorithm, and a simultaneous perturbation stochastic approximation (SPSA) algorithm.

16. The power amplifier apparatus of claim 14, further comprising:
a bias control circuit connected to the transistor and the adaptive controller, wherein the adaptive controller is configured to apply the calculated new bias voltage to the transistor via the bias control circuit.

17. The power amplifier apparatus of claim 1, wherein the signal quality monitor is further configured to measure the output signal quality of the PA using adjacent channel leakage ratio (ACLR).

18. The power amplifier apparatus of claim 1, wherein the signal quality monitor is configured to measure the output signal quality of the PA using operating-band unwanted emission.

19. A method of optimizing a power amplifier (PA) performance, wherein the power amplifier comprises at least one transistor, the method comprising:
initializing a bias voltage of the transistor;
receiving a first measurement indicating a power efficiency of the PA;
receiving a second measurement indicating an output signal quality of the PA, wherein the second measurement is measured using at least one of: (i) error vector magnitude (EVM) or (ii) operating-band unwanted emission;
evaluating the first and second measurement;
calculating a new bias voltage for the transistor based on the evaluation of the first and second measurement; and
applying the calculated new bias voltage for the transistor.

20. The method of claim 19, wherein the first measurement indicating the power efficiency of the PA is measured at least based on a portion of an output signal of the PA and a direct current (DC) power consumption of the PA.

21. The method of claim 19, wherein the second measurement indicating the output signal quality of the PA is measured at least based on a portion of an output signal of the PA.

22. The method of 18 further comprising:
receiving the second measurement indicating an output signal quality of the PA wherein the second measurement is measured using error vector magnitude.

23. The method of 18 further comprising:
receiving the second measurement indicating an output signal quality of the PA wherein the second measurement is measured using adjacent channel leakage ratio (ACLR) and one of EVM or operating-band unwanted emission.

24. The method of 18 further comprising:
receiving the second measurement indicating an output signal quality of the PA wherein the second measurement is measured using operating-band unwanted emission.

* * * * *